United States Patent
Howard et al.

(10) Patent No.: US 10,454,027 B1
(45) Date of Patent: Oct. 22, 2019

(54) PHASE-CHANGE MATERIAL (PCM) RADIO FREQUENCY (RF) SWITCHES WITH STRESSOR LAYERS AND CONTACT ADHESION LAYERS

(71) Applicant: Newport Fab, LLC, Newport Beach, CA (US)

(72) Inventors: David J. Howard, Irvine, CA (US); Jefferson E. Rose, Hawthorne, CA (US); Gregory P. Slovin, Irvine, CA (US); Nabil El-Hinnawy, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/267,719

(22) Filed: Feb. 5, 2019

Related U.S. Application Data

(63) Continuation-in-part of application No. 16/114,106, filed on Aug. 27, 2018, and a continuation-in-part of application No. 16/103,587, filed on Aug. 14, 2018, and a continuation-in-part of application No. 16/103,490, filed on Aug. 14, 2018, and a continuation-in-part of application No. 16/103,646, filed on Aug. 14, 2018.

(51) Int. Cl.
*H01L 45/00* (2006.01)

(52) U.S. Cl.
CPC .......... *H01L 45/1226* (2013.01); *H01L 45/06* (2013.01); *H01L 45/1286* (2013.01); *H01L 45/143* (2013.01); *H01L 45/144* (2013.01)

(58) Field of Classification Search
CPC .. H01L 45/06; H01L 45/1226; H01L 45/1286
See application file for complete search history.

(56) References Cited

U.S. PATENT DOCUMENTS

| 5,976,932 | A | 11/1999 | Kerber |
| 6,448,576 | B1 | 9/2002 | Davis |
| 9,257,647 | B2 * | 2/2016 | Borodulin ............. H01L 45/126 |

(Continued)

FOREIGN PATENT DOCUMENTS

WO WO 2016/028362 2/2016

OTHER PUBLICATIONS

G. Slovin, et al. "AlN Barriers for Capacitance Reduction in Phase-Change RF Switches," in *IEEE Electron Device Letters*, vol. 37, No. 5, pp. 568-571, May 2016.

(Continued)

*Primary Examiner* — Allison Bernstein
(74) *Attorney, Agent, or Firm* — Farjami & Farjami LLP

(57) ABSTRACT

A radio frequency (RF) switch includes a stressed phase-change material (PCM) and a heating element underlying an active segment of the stressed PCM and extending outward and transverse to the stressed PCM. In one approach, at least one transition layer is situated over the stressed PCM. An encapsulation layer is situated over the at least one transition layer and on first and second sides of the stressed PCM. A stressor layer is situated over the encapsulation layer and the said stressed PCM. Alternatively or additionally, contacts of the RF switch extend into passive segments of a PCM, wherein adhesion layers adhere the passive segments of the PCM to the contacts.

20 Claims, 7 Drawing Sheets

(56) References Cited

U.S. PATENT DOCUMENTS

| | | | |
|---|---|---|---|
| 9,368,720 B1 * | 6/2016 | Moon | H01L 45/1286 |
| 9,419,213 B2 * | 8/2016 | Raieszadeh | H01L 45/06 |
| 9,640,759 B1 | 5/2017 | Curioni | |
| 9,917,104 B1 | 3/2018 | Roizin | |
| 2006/0246712 A1 | 11/2006 | Kim | |
| 2007/0075347 A1 | 4/2007 | Lai | |
| 2013/0187120 A1 | 7/2013 | Redaelli | |
| 2013/0285000 A1 | 10/2013 | Arai | |
| 2014/0264230 A1 | 9/2014 | Borodulin | |
| 2015/0090949 A1 | 4/2015 | Chang | |
| 2016/0035973 A1 | 2/2016 | Raieszadeh | |
| 2016/0071653 A1 | 3/2016 | Lamorey | |
| 2017/0092694 A1 | 3/2017 | BrightSky | |
| 2017/0365427 A1 | 12/2017 | Borodulin | |
| 2018/0269393 A1 | 9/2018 | Zhang | |
| 2019/0064555 A1 | 2/2019 | Hosseini | |
| 2019/0067572 A1 | 2/2019 | Tsai | |

OTHER PUBLICATIONS

Ran, Cheng, et al. "GeTe Liner Stressor Featuring Phase-Change-Induced Volume Contraction for Strain Engineering of Sub-50-nm p-Channel FinFETs: Simulation and Electrical. Characterization," *IEEE Transactions on Electron Devices*, vol. 61, No. 8, Aug. 2014. pp. 2647-2655.

G. Slovin, et al., "Design Criteria in Sizing Phase-Change RF Switches," in *IEEE Transactions on Microwave Theory and Techniques*, vol. 65, No. 11, pp. 4531-4540, Nov. 2017.

N. El-Hinnawy et al., "A 7.3 THz Cut-Off Frequency, Inline, Chalcogenide Phase-Change RF Switch Using an Independent Resistive Heater for Thermal Actuation," *2013 IEEE Compound Semiconductor Integrated Circuit Symposium* (*CSICS*), Monterey, CA, 2013, pp. 1-4.

\* cited by examiner

PHASE-CHANGE MATERIAL (PCM) RADIO FREQUENCY (RF) SWITCHES WITH STRESSOR LAYERS AND CONTACT ADHESION LAYERS

CLAIMS OF PRIORITY

The present application is a continuation-in-part of and claims the benefit of and priority to application Ser. No. 16/103,490 filed on Aug. 14, 2018, titled "Manufacturing RF Switch Based on Phase-Change Material,". The present application is also a continuation-in-part of and claims the benefit of and priority to application Ser. No. 16/103,587 filed on Aug. 14, 2018, titled "Design for High Reliability RF Switch Based on Phase-Change Material,". The present application is also a continuation-in-part of and claims the benefit of and priority to application Ser. No. 16/103,646 filed on Aug. 14, 2018, titled "PCM RF Switch Fabrication with Subtractively Formed Heater,". The present application is further a continuation-in-part of and claims the benefit of and priority to application Ser. No. 16/114,106 filed on Aug. 27, 2018, titled "Fabrication of Contacts in an RF Switch Having a Phase-Change Material (PCM) and a Heating Element,". The disclosures and contents of all of the above-identified applications are hereby incorporated fully by reference into the present application.

BACKGROUND

Phase-change materials (PCM) are capable of transforming from a crystalline phase to an amorphous phase. These two solid phases exhibit differences in electrical properties, and semiconductor devices can advantageously exploit these differences. Given the ever-increasing reliance on radio frequency (RF) commnunication, there is particular need for RF switching devices to exploit phase-change materials. However, the capability of phase-change materials for phase transformation depends heavily on how they are exposed to thermal energy and how they are allowed to release thermal energy. For example, in order to transform into an amorphous phase, phase-change materials may need to achieve temperatures of approximately seven hundred degrees Celsius (700° C.) or more, and may need to cool down within hundreds of nanoseconds.

Additionally, when transforming from a crystalline phase to an amorphous phase, PCM exhibits volume expansion which introduces stresses that cause defects in the PCM, contacts, and other structures in PCM RF switches. These defects reduce reliability and can cause failure of PCM RF switches. Over numerous cycles, PCM volume expansion (when transforming from a crystalline phase to an amorphous phase) and contraction (when transforming from an amorphous phase to a crystalline phase) can also exacerbate otherwise minor defects. Accordingly, accommodating PCM in PCM RF switches can present significant manufacturing challenges. Specialty manufacturing is often impractical, and large scale manufacturing generally trades practicality for the ability to control device characteristics.

Thus, there is a need in the art for PCM RF switches having increased reliability against defects associated with phase transformation volume expansion and contraction.

SUMMARY

The present disclosure is directed to phase-change material (PCM) radio frequency (RF) switches with stressor layers and contact adhesion layers, substantially as shown in and/or described in connection with at least one of the figures, and as set forth in the claims.

DETAILED DESCRIPTION

Figure 1:
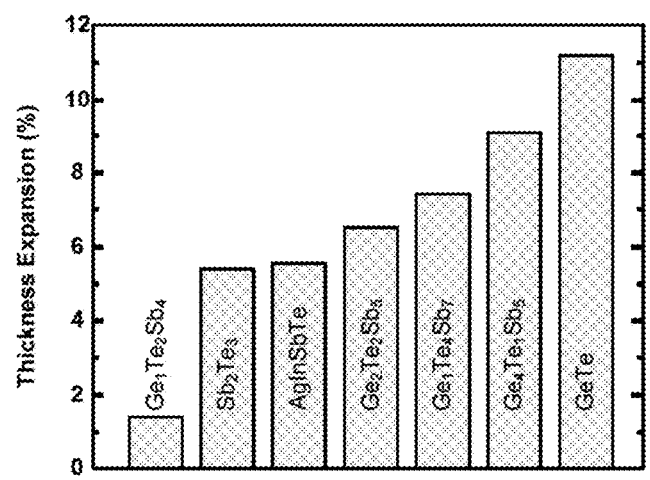
FIG. 1 illustrates an exemplary graph of phase-change material (PCM) film thickness expansion for various PCMs according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates an exemplary graph of phase-change material (PCM) film thickness expansion for various PCM films according to one implementation of the present application. The graph in FIG. 1 represents exemplary expansions in thickness for various PCM films, such as PCM 110 in FIG. 2A, expressed as percentages of their original thicknesses. For example, as shown in FIG. 1, a PCM film having material composition $Ge_1Te_2Sb_4$ exhibits thickness expansion of approximately one and a half percent (1.5%). As another example, a PCM film having material composition GeTe exhibits thickness expansion approximately eleven percent (11%). The initial thickness of a PCM can be chosen based upon target device specification such as sheet resistance, power to crystallize the PCM, power to amorphize the PCM, or other considerations. Accordingly, thickness expansion can result in unintended behavior. As described below, thickness expansion also significantly impacts the reliability of a PCM radio frequency (RF) switch.

Figure 2A:
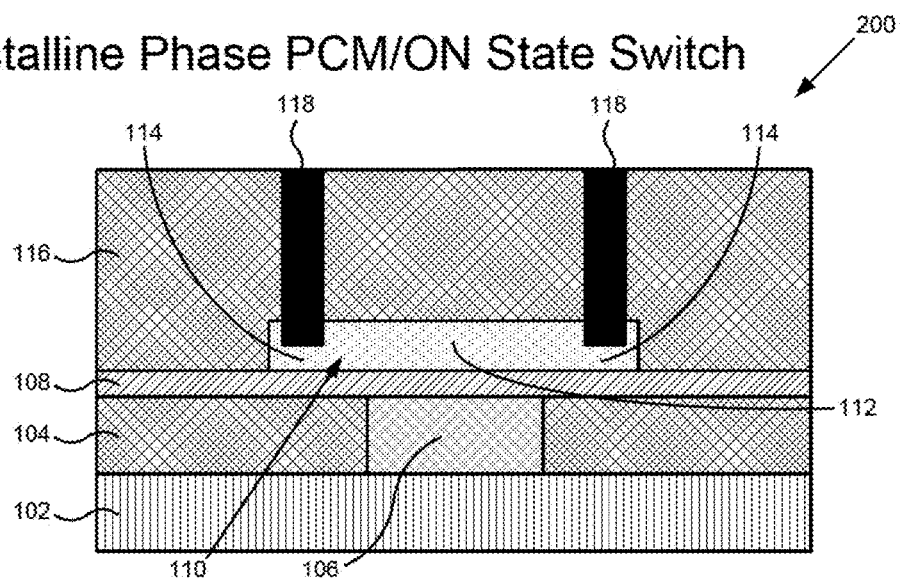
FIG. 2A illustrates a cross-sectional view of a portion of a PCM radio frequency (RF) switch according to one implementation of the present application.

FIG. 2A illustrates a cross-sectional view of a portion of a PCM RF switch according to one implementation of the present application. FIG. 2A represents PCM RF switch 200 in an ON state, where active segment 112 of PCM 110 is in a crystalline phase. RF switch 200 includes substrate 102, lower dielectric 104, heating element 106, thermally conductive and electrically insulating material 108, PCM 110 having active segment 112 and passive segments 114, contact dielectric 116, and contacts 118. PCM RF switch 200 may include other structures not shown in FIG. 2A.

Substrate 102 is situated under lower dielectric 104. In one implementation, substrate 102 is an insulator, such as silicon oxide ($Si_XO_Y$). In various implementations, substrate 102 is a silicon (Si), silicon-on-insulator (SOI), sapphire, complementary metal-oxide-semiconductor (CMOS), bipolar CMOS (BiCMOS), or group III-V substrate. In various implementations, a heat spreader is integrated with substrate 102, or substrate 102 itself performs as a heat spreader. Substrate 102 can have additional layers (not shown in FIG. 2A). In one implementation, substrate 102 can comprise a plurality of interconnect metal levels and interlayer dielectric layers. Substrate 102 can also comprise a plurality of devices, such as integrated passive devices (IPDs) (not shown in FIG. 2A).

Lower dielectric 104 is situated oil top of substrate 102, and is adjacent to the sides of heating element 106. In the present implementation, lower dielectric 104 extends along the width of RF switch 200, and is also coplanar with heating element 106. In various implementations, lower dielectric 104 can have a relative width and/or a relative thickness greater or less than shown in FIG. 2A. Lower dielectric 104 may comprise a material with thermal conductivity lower than that of thermally conductive and electrically insulating material 108. In various implementations, lower dielectric 104 can comprise silicon oxide ($Si_XO_Y$), silicon nitride ($Si_XN_Y$), or another dielectric.

Heating element 106 is situated in lower dielectric 104. Heating element 106 also underlies active segment 112 of PCM 110. Heating element 106 extends transverse to PCM 110 (i.e., into and out of the page in FIG. 2A). Active segment 112 of PCM 110 can be approximately centered along the extension of heating element 106. Heating element 106 generates a crystallizing heat pulse or an amorphizing heat pulse for transforming active segment 112 of PCM 110. Heating element 106 can comprise any material capable of Joule heating. Preferably, heating element 106 comprises a material that exhibits minimal or substantially no electromigration, thermal stress migration, and/or agglomeration. In various implementations, heating element 106 can comprise tungsten (W), molybdenum (Mo), titanium (Ti), titanium nitride (TiN), titanium tungsten (TiW), tantalum (Ta), tantalum nitride (TaN), nickel chromium (NiCr), or nickel chromium silicon (NiCrSi). For example, in one implementation, heating element 106 comprises tungsten lined with titanium and titanium nitride. Heating element 106 may be formed by a damascene process, a subtractive etch process, or any other suitable process. Heater contacts (not shown in FIG. 2A) can be situated at two ends of heating element 106 and occupy a relatively a large area in order to provide for connection of, for example, electrodes of a pulse generator (not shown in FIG. 2A) that generates crystallizing voltage or current pulses and amorphizing voltage or current pulses.

Thermally conductive and electrically insulating material 108 is a layer situated on top of heating element 106 and lower dielectric 104, and under PCM 110 and, in particular, under active segment 112 of PCM 110. Thermally conductive and electrically insulating material 108 ensures efficient heat transfer from heating element 106 toward active segment 112 of PCM 110, while electrically insulating heating element 106 from PCM 110 and other neighboring structures. Thermally conductive and electrically insulating material 108 can comprise any material with high thermal conductivity and high electrical resistivity. In various implementations, thermally conductive and electrically insulating material 108 can comprise aluminum nitride (AlN), aluminum oxide ($Al_XO_Y$), beryllium oxide ($Be_XO_Y$), silicon carbide (SiC), diamond, or diamond-like carbon.

PCM 110 is situated on top of thermally conductive and electrically insulating material 108 and over heating element 106. PCM 110 includes active segment 112 and passive segments 114. Active segment 112 of PCM 110 approximately overlies heating element 106 and is approximately defined by heating element 106. Passive segments 114 of PCM 110 extend outward and are transverse to heating element 106. As used herein, "active segment" refers to a segment of PCM that transforms between crystalline and amorphous phases, for example, in response to a crystallizing or an amorphizing heat pulse generated by heating element 106, whereas "passive segment" refers to a segment of PCM that does not make such transformation and maintains a crystalline phase (i.e., maintains a conductive phase). With proper heat pulses and heat dissipation, active segment 112 of PCM 110 can transform between crystalline and amorphous phases, allowing RF switch 200 to switch between ON and OFF states respectively.

PCM 110 can be germanium telluride ($Ge_XTe_Y$), germaniumn antimony telluride ($Ge_XSb_YTe_Z$), germanium selenide ($Ge_XSe_Y$), or any other chalcogenide. In various implementations, PCM 110 can be germanium telluride having from forty percent to sixty percent germanium by composition (i.e., $Ge_XTe_Y$, where $0.4 \leq X \leq 0.6$ and $Y=1-X$). The material for PCM 110 can be chosen based upon ON state resistivity, OFF state electric field breakdown threshold, crystallization temperature, melting temperature, or other considerations. PCM 110 can be provided, for example, by physical vapor deposition (PVD), sputtering, ion beam deposition, chemical vapor deposition (CVD), evaporation, or atomic layer deposition (ALD). In one implementation, PCM 110 can have a thickness of approximately five hundred angstroms to approximately two thousand angstroms (500 Å-2000 Å). In other implementations, PCM 110 can have any other thicknesses. The thickness of PCM 110 can be chosen based upon sheet resistance, crystallization power, amorphization power, or other considerations. It is noted that in FIG. 2A, current flowing in heating element 106 flows substantially under active segment 112 of PCM 110.

Contact dielectric 116 is situated over PCM 110 and over thermally conductive and electrically insulating material 108. In various implementations, contact dielectric 116 is $Si_XO_Y$, boron-doped $Si_XO_Y$, phosphorous-doped $Si_XO_Y$, $Si_XN_Y$, or another dielectric. In various implementations, contact dielectric 116 is a low-k dielectric, such as fluorinated silicon dioxide, carbon-doped silicon oxide, or spin-on organic polymer. Contact dielectric 116 can be provided, for example, by plasma enhanced CVD (PECVD), high density plasma CVD (HDP-CVD), or spin-on processes.

Contacts 118 extend through contact dielectric 116 and partially into passive segments 114 of PCM 110. Contacts 118 provide RF signals to/from PCM 110. In various implementations, contacts 118 can comprise tungsten (W), aluminum (Al), or copper (Cu).

Figure 2B:
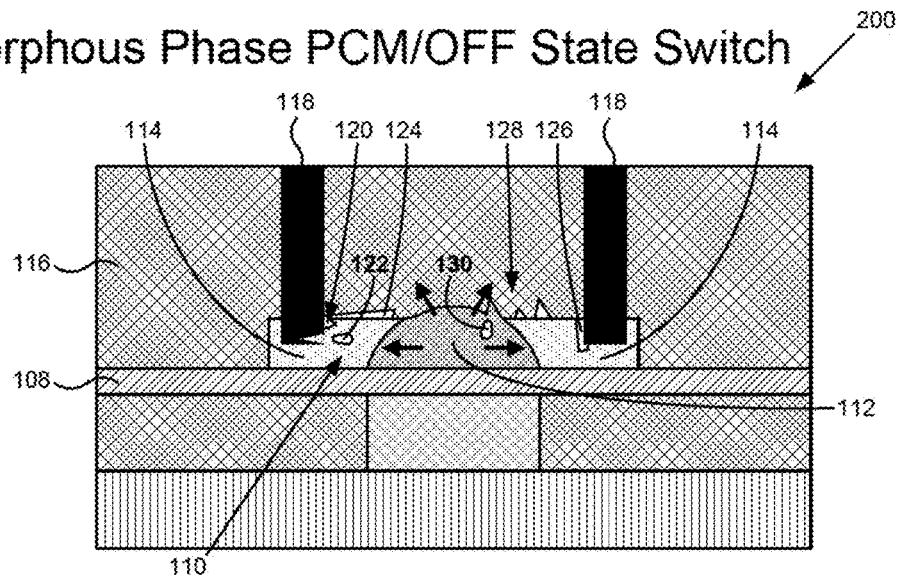
FIG. 2B illustrates a cross-sectional view of a portion of a PCM RF switch corresponding to the PCM RF switch of FIG. 2A according to one implementation of the present application.

FIG. 2B illustrates a cross-sectional view of a portion of a PCM RF switch corresponding to the PCM RF switch of FIG. 2A according to one implementation of the present application. FIG. 2B represents PCM RF switch 200 in an OFF state, after an amorphizing pulse has transformed active segment 112 of PCM 110 into an amorphous phase.

As shown in FIG. 2B, active segment 112 of PCM 110 exhibits volume expansion upon becoming amorphous. The arrows extending outward from active segment 112 of PCM 110 in FIG. 2B generally illustrate the directions of the volume expansion. In the present implementation, volume expansion in a downward direction is limited because thermally conductive and electrically insulating material 108 is relatively rigid compared to contact dielectric 116. Additionally, volume expansion is limited because passive segments 114 of PCM 110 maintain a crystalline phase, and only active segment 112 of PCM 110 becomes amorphous. Notably, the volume expansion causes the top surface of PCM 110 to deform, and also causes defects 120, 122, 124, 126, 128 and 130.

Defects 120 represent cracking in passive segments 114 of PCM 110 and/or in contacts 118 near their interface. Passive segments 114 of PCM 110 can be slightly damaged when holes or trenches for contacts 118 are etched into passive segments 114 of PCM 110. As RF switch 200 cycles between ON and OFF states, active segment 112 of PCM 110 expands and contracts, in turn causing stresses in passive segments 114 of PCM 110. These stresses exacerbate the damage caused when holes or trenches for contacts 118 were etched into passive segments 114 of PCM 110, and crack passive segments 114 of PCM 110 and/or contacts 118 near their interface as shown by defects 120.

Defect 122 represents a void in passive segments 114 of PCM 110. When active segment 112 of PCM 110 becomes amorphous and expands, if contacts 118 are cracked as described above, PCM 110 will diffuse into cracks in contacts 118 and leave a void as shown by defect 122.

Defect 124 represents delamination of contact dielectric 116 and PCM 110. When active segment 112 of PCM 110 becomes amorphous and expands, it applies stresses to contact dielectric 116, and contact dielectric 116 delaminates from PCM 110 as shown by defect 124. Delamination of contact dielectric 116 and PCM 110 is more likely to occur where PCM 110 is cracked near its interface with contact dielectric 116, as shown by defects 120.

Defect 126 represents delamination of passive segments 114 of PCM 110 and contacts 118. As RF switch 200 cycles between ON and OFF states, active segment 112 of PCM 110 expands and contracts, in turn causing stresses in passive segments 114 of PCM 110, and passive segments 114 of PCM 110 delaminate from contacts 118 as shown by defect 126. Delamination of passive segments 114 of PCM 110 and contacts 118 is more likely to occur where PCM 110 is cracked near its interface with contacts 118, as shown by defects 120.

Defects 128 represent cracking in contact dielectric 116 near its interface with PCM 110. When active segment 112 of PCM 110 becomes amorphous and expands, it applies stresses to contact dielectric 116 and cracks contact dielectric 116 near its interface with PCM 110 as shown by defects 128.

Defect 130 represents a void in active segment 112 of PCM 110. When active segment 112 of PCM 110 becomes amorphous and expands, if contact dielectric 116 is cracked near its interface with PCM 110 as described above, PCM 110 will diffuse into cracks in contact dielectric 116 and leave a void as shown by defect 130.

Defects 120, 122, 124, 126, 128 and 130 result in several disadvantages for RF switch 200, including higher ON state resistance ($R_{ON}$), inability to transform active segment 112 of PCM 110, physical and electrical damage to structures, etc. Defects 120, 122, 124, 126, 128 and 130 are caused by active segment 112 of PCM 110 expanding and contracting, and reduce the reliability of RF switch 200, and can cause RF switch 200 to fail.

Figure 3:
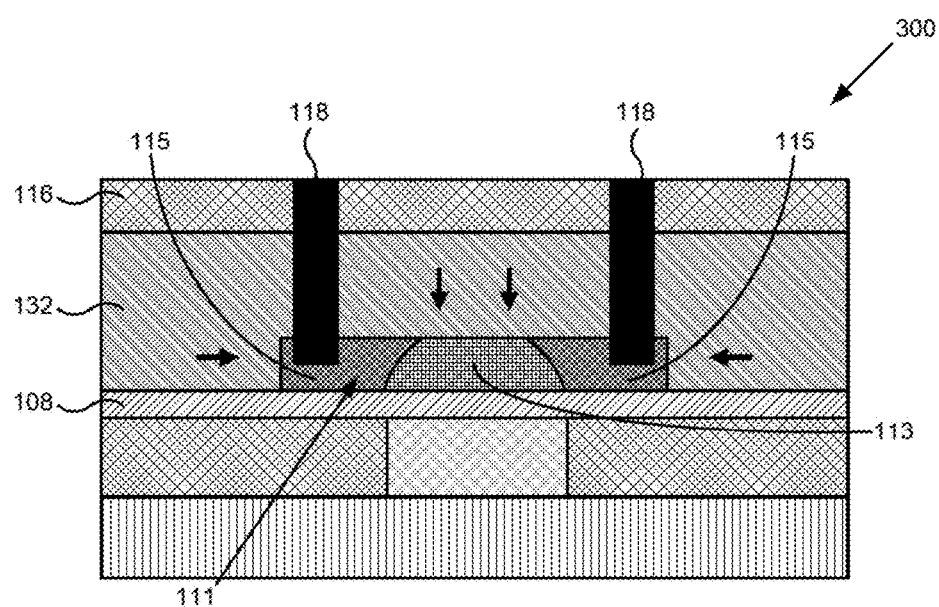
FIG. 3 illustrates a cross-sectional view of a portion of a PCM RF switch according to one implementation of the present application.

FIG. 3 illustrates a cross-sectional view of a portion of a PCM RF switch according to one implementation of the present application. FIG. 3 represents PCM RF switch 300 in an OFF state, after an amorphizing pulse has transformed stressed active segment 113 of stressed PCM 111 into an amorphous phase. RF switch 300 in FIG. 3 is similar to RF switch 200 in FIGS. 2A and 2B, except that RF switch 300 in FIG. 3 includes stressed PCM 111 situated over thermally conductive and electrically insulating material 108, and stressor layer 132 situated over stressed PCM 111. Contact dielectric 116 is situated over stressor layer 132. Contacts 118 extend through contact dielectric 116 and through stressor layer 132, and partially into stressed passive segments 115 of stressed PCM 111.

Stressor layer 132 provides stresses that counteract volume expansion that would otherwise occur upon stressed active segment 113 of stressed PCM 111 becoming amorphous. In the present implementation, stressor layer 132 provides primarily compressive stresses on stressed PCM 111. In other implementations, stressor layer 132 can provide tensile stresses, or additional stressor layers can provide tensile stresses. Arrows extending inward from stressor layer 132 in FIG. 3 generally illustrate the directions of stresses provided by stressor layer 132. Stressor layer 132 can be, for example, stressed silicon nitride ($Si_xN_Y$) or stressed silicon oxynitride ($Si_xO_YN_Z$).

Stressor layer 132 can be formed in any manner know in the art. For example, a deposition process can be used that varies the ratio of ammonia ($NH_3$) and silane ($SiH_4$) gases from those ratios normally used to deposit unstressed $Si_xN_Y$, such that a large quantity of hydrogen remains trapped in a deposited $Si_xN_Y$ film. Then the hydrogen can be released, for example, by annealing or ultraviolet (UV) treatment, causing the deposited $Si_xN_Y$ film to shrink and become stressed. Stressor layer 132 can also be a carbon ceramic, where carbon is introduced to improve the ability of the ceramic to provide compressive stresses. In one implementation, stressor layer 132 can have a thickness of approximately two thousand angstroms to approximately eight thousand angstroms (2000 Å-8000 Å). Thinner stressor layers may also have effective impact on the compression of stressed PCM 111 and especially stressed active segment 113, depending on magnitude of stress intrinsic to the stressor layer.

Because RF switch 300 includes stressor layer 132, volume expansion of stressed PCM 111 in upward and outward directions is limited. Volume expansion of stressed PCM 111 in a downward direction is limited because thermally conductive and electrically insulating material 108 is relatively rigid. Stressed PCM 111 exhibits little or negligible volume expansion upon stressed active segment 113 of stressed PCM 111 becoming amorphous. Accordingly, RF switch 300 in FIG. 3 avoids defects, such as defects 120, 122, 124, 126, 128 and 130 in RF switch 200 in FIG. 2B, and the reliability of RF switch 300 is improved.

Figure 4:
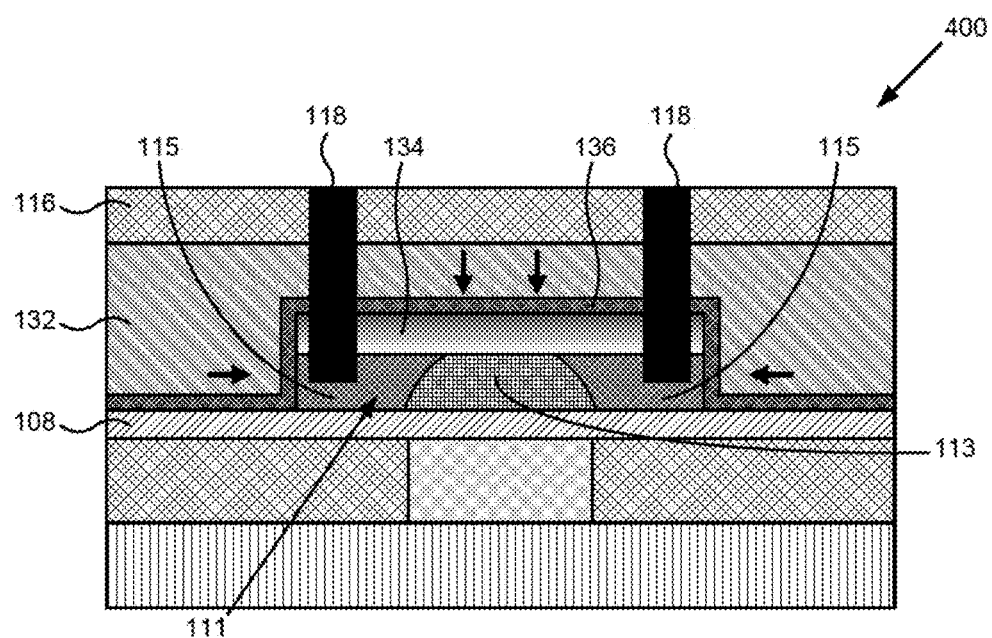
FIG. 4 illustrates a cross-sectional view of a portion of a PCM RF switch according to one implementation of the present application.

FIG. 4 illustrates a cross-sectional view of a portion of a PCM RF switch according to one implementation of the present application. FIG. 4 represents PCM RF switch 400 in an OFF state, after an amorphizing pulse has transformed stressed active segment 113 of stressed PCM 111 into an amorphous phase. RF switch 400 in FIG. 4 is similar to RF switch 300 in FIG. 3, except that RF switch 400 in FIG. 4 includes transition layer(s) 134 situated over stressed PCM 111, and encapsulation layer 136 situated over transition layer(s) 134. Encapsulation layer 136 is also situated on sides of transition layer(s) 134 and sides of stressed PCM 111, and over thermally conductive and electrically insulating material 108. Stressor layer 132 is situated over encapsulation layer 136. Contact dielectric 116 is situated over stressor layer 132. Contacts 118 extend through contact dielectric 116, stressor layer 132, encapsulation layer 136, and transition layer(s) 134, and partially into stressed passive segments 115 of stressed PCM 111.

The ability of stressor layer 132 to transfer stress is heavily dependent on good adhesion. Although nitrides are often used in stressor layers, nitrides generally do not adhere well to PCM films. For example, where stressor layer 132 is $Si_XN_Y$ and stressed PCM 111 is $Ge_XTe_Y$, stressor layer 132 would not adhere well directly to stressed PCM 111. Stressor layer 132 and stressed PCM 111 could delaminate, and stressor layer 132 could fail to provide stresses to counteract volume expansion upon stressed active segment 113 of stressed PCM 111 becoming amorphous.

Transition layer(s) 134 and encapsulation layer 136 improve adhesion between stressor layer 132 and stressed PCM 111. Transition layer(s) 134 can be a single transition layer or a plurality of transition layers. In one example, transition layer(s) 134 are a sequential stack of germanium oxide ($Ge_XO_Y$), silicon oxide ($Si_XO_Y$), and silicon nitride ($Si_XN_Y$) transition layers. In another example, transition layer(s) 134 are a sequential stack of germanium nitride ($Ge_XN_Y$) and silicon nitride ($Si_XN_Y$) transition layers. In yet another example, transition layer(s) 134 are a sequential stack of germanium oxynitride ($Ge_XO_YN_Z$) and silicon oxynitride ($Si_XO_YN_Z$) transition layers. In one implementation, each layer of transition layer(s) 134 can have a thickness of approximately fifty angstroms to approximately five hundred angstroms (50 Å-500 Å).

Encapsulation layer 136 protects transition layer(s) 134 and stressed PCM 111 during fabrication of RF switch 400. Encapsulation layer 136 also provides adhesion between stressor layer 132 and transition layer(s) 134. Encapsulation layer 136 is further situated on sides of transition layer(s) 134 and sides of stressed PCM 111 in order to provide adhesion between transition layer(s) 134 and stressed PCM 111. In various implementations, encapsulation layer 136 can comprise silicon oxide ($Si_XO_Y$), silicon nitride ($Si_XN_Y$), or another dielectric. In one implementation, encapsulation layer 136 can have a thickness of approximately fifty angstroms to approximately five hundred angstroms (50 Å-500 Å).

Because RF switch 400 includes transition layer(s) 134 and encapsulation layer 136, RF switch 400 improves adhesion between stressor layer 132 and stressed PCM 111. RF switch 400 avoids delamination between stressor layer 132 and stressed PCM 111, and efficiently transfers stresses provided by stressor layer 132 to stressed PCM 111. Accordingly, RF switch 400 in FIG. 4 improves reliability against defects, such as defects 120, 122, 124, 126, 128 and 130 in RF switch 200 in FIG. 2B.

Figure 5:
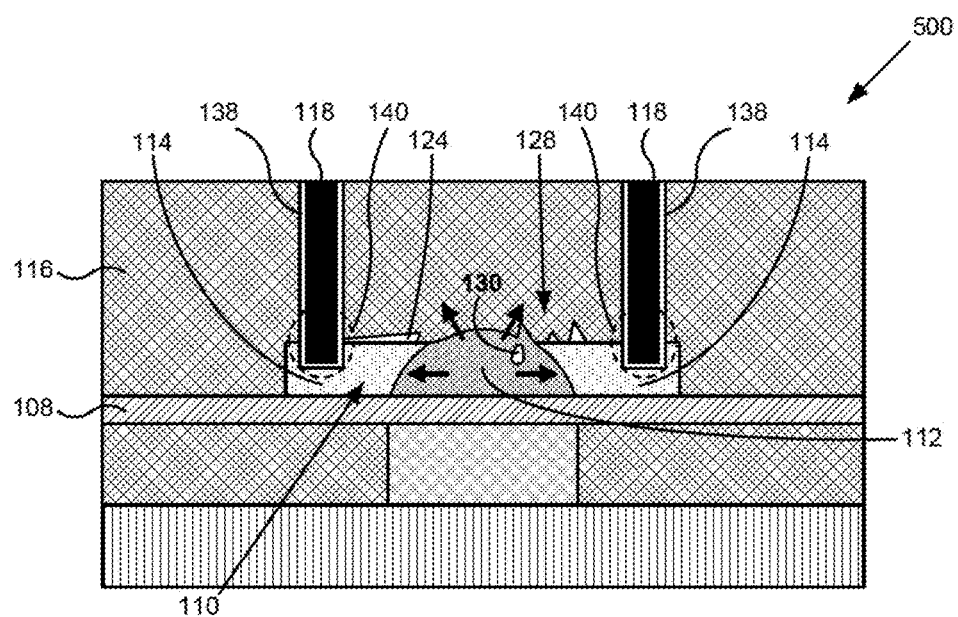
FIG. 5 illustrates a cross-sectional view of a portion of a PCM RF switch according to one implementation of the present application.

FIG. 5 illustrates a cross-sectional view of a portion of a PCM RF switch according to one implementation of the present application. FIG. 5 represents PCM RF switch 500 in an OFF state, after an amorphizing pulse has transformed active segment 112 of PCM 110 into an amorphous phase. RF switch 500 in FIG. 5 is similar to RF switch 200 in FIG. 2B, except that RF switch 500 in FIG. 5 includes adhesion layers 138 lining contacts 118. Notably, RF switch 500 in FIG. 5 does not include a stressor layer and a stressed PCM, such as stressor layer 132 and stressed PCM 111 in RF switch 300 in FIG. 3.

Adhesion layers 138 adhere contacts 118 to passive segments 114 of PCM 110. Adhesion layers 138 are deposited after holes or trenches are etched for contacts 118. Adhesion layers 138 fill portions of contact dielectric 116 and portions of PCM 110 that were slightly damaged by the etch. Afterwards, contacts 118 can be formed over adhesion layers 138. Adhesion layers 138 can be deposited using CVD, or any other suitable technique. Adhesion layers 138 can be TiN, or any other metal. In one implementation, adhesion layers 138 can have a thickness of approximately twenty angstroms to approximately two hundred angstroms (20 Å-200 Å).

Because adhesion layers 138 fill portions of PCM 110 that were slightly damaged by etching and adhere contacts 118 to passive segments 114 of PCM 110, regions 140 of RF switch 500 are substantially free of defects associated with volume expansion or contraction. As active segment 112 of PCM 110 expands and contracts, contacts 118 adhere to passive segments 114 of PCM 110. Stresses caused in passive segments 114 of PCM 110 do not exacerbate damage caused by etching, and cracks do not form in passive segments 114 of PCM 110 and/or contacts 118 near their interface. Notably, regions 140 of RF switch 500 in FIG. 5 do not include defects 120 of RF switch 200 in FIG. 2B. Correspondingly, because cracks do not form in contacts 118, PCM 110 does not diffuse into cracks in contacts 118 and does not leave a void. Thus, regions 140 of RF switch 500 in FIG. 5 do not include defect 122 of RF switch 200 in FIG. 2B.

As active segment 112 of PCM 110 expands and contracts, adhesion layers 138 adhere contacts 118 to passive segments 114 of PCM 110. Stresses caused in passive segments 114 of PCM 110 do not delaminate passive segments 114 of PCM 110 from contacts 118. Notably, regions 140 of RF switch 500 in FIG. 5 do not include defect 126 of RF switch 200 in FIG. 2B.

When active segment 112 of PCM 110 become amorphous and expands, it applies stresses to contact dielectric 116. Contact dielectric 116 could still delaminate from PCM 110 as shown by defect 124. Contact dielectric 116 could still crack as shown by defect 128. And PCM 110 could still diffuse and leave a void as shown by defect 130. However, compared to RF switch 200 in FIG. 2B, RF switch 500 in FIG. 5 is significantly less likely to experience these defects since adhesion layers 138 adhere contact dielectric 116 to passive segments 114 of PCM 110.

Because RF switch 500 in FIG. 5 includes adhesion layers 138, RF switch 500 avoids defects in regions 140, such as defects 120, 122, and 126 in RF switch 200 in FIG. 2B, and also reduces the likelihood of other defects, such as defects 124, 128, and 130. RF switch 500 improves reliability against defects, despite the fact that RF switch 500 does not include a stressor layer, such as stressor layer 132 in RF switch 300 in FIG. 3.

Figure 6A:
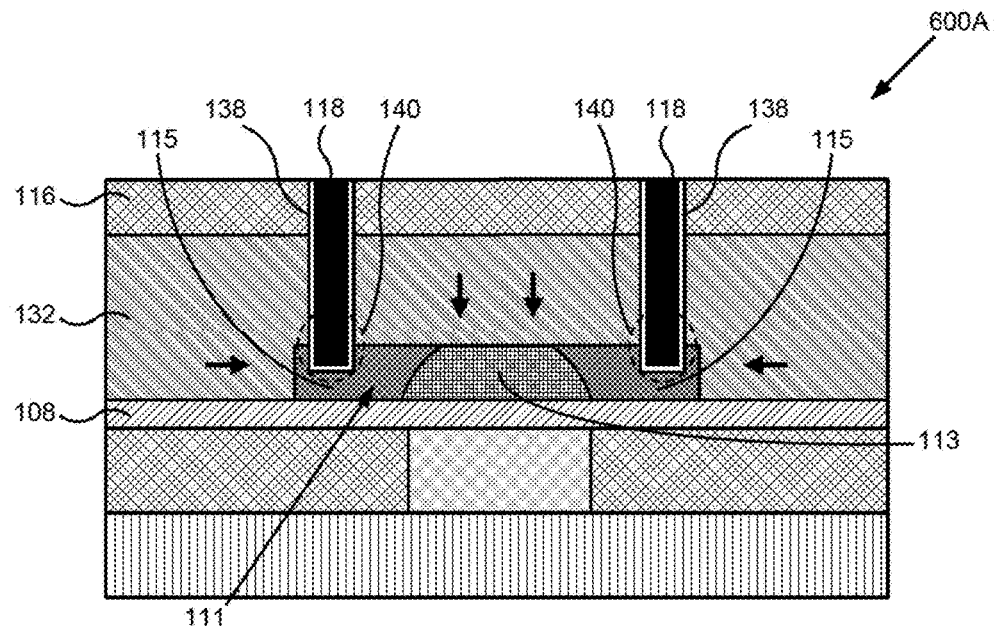
FIG. 6A illustrates a cross-sectional view of a portion of a PCM RF switch according to one implementation of the present application.

FIG. 6A illustrates a cross-sectional view of a portion of a PCM RF switch according to one implementation of the present application. FIG. 6A represents PCM RF switch 600A in an OFF state, after an amorphizing pulse has transformed stressed active segment 113 of stressed PCM 111 into an amorphous phase. RF switch 600A in FIG. 6A is similar to RF switch 300 in FIG. 3, except that RF switch 600A in FIG. 6A includes adhesion layers 138 lining contacts 118.

RF switch 600A in FIG. 6A includes both stressor layer 132 and adhesion layers 138. Stressed PCM 111 is situated over thermally conductive and electrically insulating material 108, and stressor layer 132 situated over stressed PCM 111. Contact dielectric 116 is situated over stressor layer 132. Contacts 118 extend through contact dielectric 116 and through stressor layer 132, and partially into stressed passive segments 115 of stressed PCM 111. Adhesion layers 138 line contacts 118, and adhere contacts 118 to stressed passive segments 115 of stressed PCM 111. Adhesion layers 138 also adhere stressor layer 132 to stressed passive segments 115 of stressed PCM 111.

As described above, stressor layer 132 provides stresses that counteract volume expansion that would otherwise occur upon stressed active segment 113 of stressed PCM 111 becoming amorphous, and stressed PCM 111 exhibits little or negligible volume expansion. As also described above, adhesion layers 138 fill portions of stressed PCM 111 that were slightly damaged by etching, such that regions 140 of RF switch 600A are substantially free of defects associated with volume expansion, and also such that the likelihood of defects in other regions is reduced.

Although stressor layer 132 provides stresses that counteract volume expansion, stressor layer 132 also provides stresses that, instead of directly counteracting expansion, convert vertical expansion into horizontal expansion. This horizontal expansion tends to cause defects near the interface of stressed passive segments 115 and contacts 118, such as defects 120, 122, and 126 in RF switch 200 in FIG. 2B. Adhesion layers 138 counteract this tendency by adhering stressed passive segments 115 of stressed PCM 111 to contacts 118. Accordingly, it is particularly useful for RF switch 600A to use adhesion layers 138 where stressor layer 132 is also used.

Figure 6B:
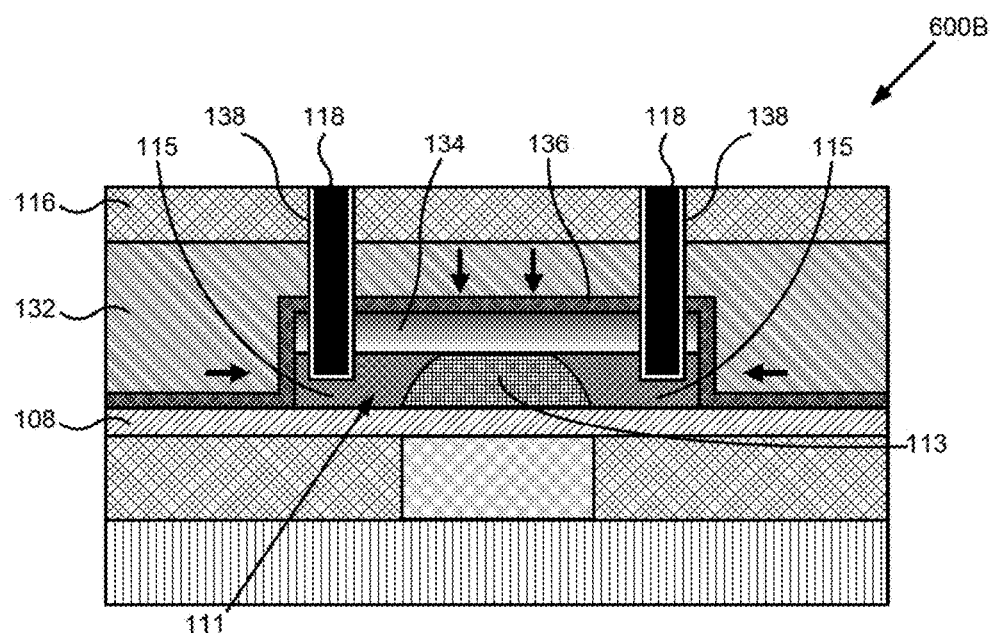
FIG. 6B illustrates a cross-sectional view of a portion of a PCM RF switch according to one implementation of the present application.

FIG. 6B illustrates a cross-sectional view of a portion of a PCM RF switch according to one implementation of the present application. FIG. 6B represents PCM RF switch 600B in an OFF state, after an amorphizing pulse has transformed stressed active segment 113 of stressed PCM 111 into an amorphous phase. RF switch 600B in FIG. 6B is similar to RF switch 400 in FIG. 4, except that RF switch 600B in FIG. 6B includes adhesion layers 138 lining contacts 118.

RF switch 600B in FIG. 6B includes stressor layer 132, transition layer(s) 134, encapsulation layer 136, and adhesion layers 138. Stressed PCM 111 is situated over thermally conductive and electrically insulating material 108. Transition layer(s) 134 are situated over stressed PCM 111, and encapsulation layer 136 is situated over transition layer(s) 134. Encapsulation layer 136 is also situated on sides of transition layer(s) 134 and sides of stressed PCM 111, and over thermally conductive and electrically insulating material 108. Stressor layer 132 is situated over encapsulation layer 136. Contact dielectric 116 is situated over stressor layer 132. Contacts 118 extend through contact dielectric 116, stressor layer 132, encapsulation layer 136, and transition layer(s) 134, and partially into stressed passive segments 115 of stressed PCM 111. Adhesion layers 138 line contacts 118, and adhere contacts 118 to stressed passive segments 115 of stressed PCM 111. Adhesion layers 138 also adhere transition layer(s) 134 to stressed passive segments 115 of stressed PCM 111.

RF switch 600B in FIG. 6B advantageously prevents expansion and associated defects as described above with respect to RF switch 600A in FIG. 6A. In addition, because RF switch 600B in FIG. 6B includes transition layer(s) 134 and encapsulation layer 136, RF switch 600B improves adhesion, avoids delamination, and efficiently transfers stresses between stressor layer 132 and stressed PCM 111.

Figure 7:
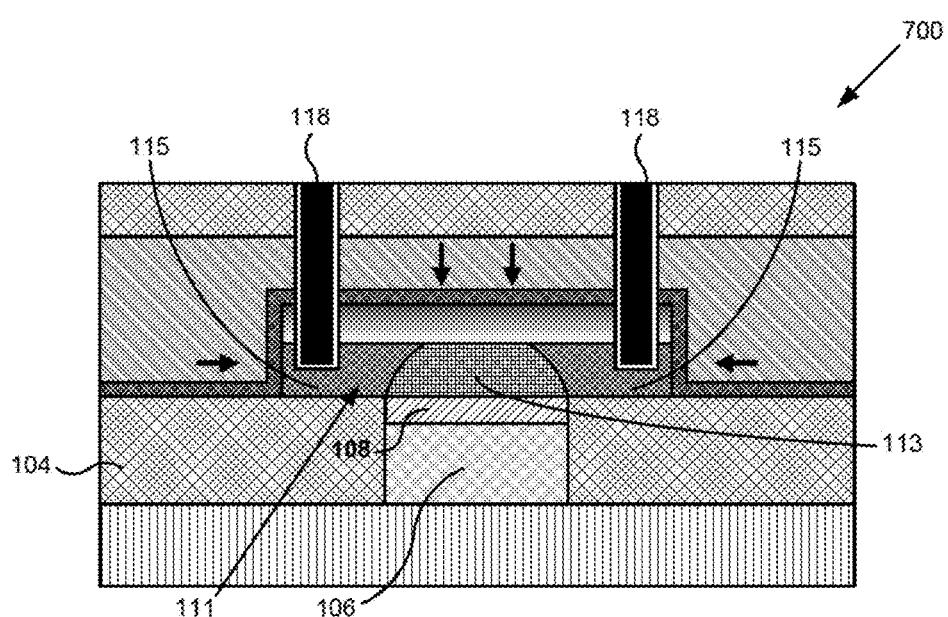
FIG. 7 illustrates a cross-sectional view of a portion of a PCM RF switch according to one implementation of the present application.

FIG. 7 illustrates a cross-sectional view of a portion of a PCM RF switch according to one implementation of the present application. FIG. 7 represents PCM RF switch 700 in an OFF state, after an amorphizing pulse has transformed stressed active segment 113 of stressed PCM 111 into an amorphous phase. RF switch 700 in FIG. 7 is similar to RF switch 600B in FIG. 6B, except that in FIG. 7, thermally conductive and electrically insulating material 108 is a nugget and is not a sheet extending along the entire width of RF switch 700.

Lower dielectric 104 is adjacent to sides of thermally conductive and electrically insulating material 108, and is substantially coplanar with the top of thermally conductive and electrically insulating material 108 (i.e. nugget 108 in the example of FIG. 7). Stressed passive segments 115 of stressed PCM 111 are situated approximately over lower dielectric 104, while stressed active segment 113 of stressed PCM 111 is situated approximately over thermally conductive and electrically insulating material 108 (i.e. nugget 108 in the example of FIG. 7). In the present implementation, thermally conductive and electrically insulating material 108 (i.e. nugget 108 in the example of FIG. 7) is aligned with heating element 106. In various implementations, thermally conductive and electrically insulating material 108 (i.e. nugget 108 in the example of FIG. 7) can be wider or narrower than shown in FIG. 7.

RF switch 700 in FIG. 7 dissipates significantly less heat towards stressed passive segments 115 of stressed PCM 111 and contacts 118 as compared to RF switch 600B in FIG. 6B. Because RF switch 700 includes lower dielectric 104 adjacent to sides of thermally conductive and electrically insulating material 108 (i.e. nugget 108 in the example of FIG. 7), more heat dissipates vertically from heating element 106 toward stressed active segment 113 of stressed PCM 111. Thus, stressed active segment 113 of stressed PCM 111 can reach even higher temperatures for the same applied pulse power. Further, RF switch 700 significantly reduces heating of stressed passive segments 115 of stressed PCM 111 and contacts 118 overlying lower dielectric 104, since unlike RF switch 600B of FIG. 6B, stressed passive segments 115 are not entirely situated directly over thermally conductive and electrically insulating material 108 (i.e. nugget 108 in the example of FIG. 7). Thus, it is less necessary to increase the width of stressed PCM 111 and space contacts 118 farther from heating element 106 (which could detrimentally increase $R_{ON}$) in order to reduce thermal cycling consequences to these structures.

Thus, various implementations of the present application achieve PCM RF switches having stressor layers and contact adhesion layers that overcome the deficiencies in the art. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:
1. A radio frequency (RF) switch comprising:
 a stressed phase-change material (PCM) and a heating element underlying an active segment of said stressed PCM and extending outward and transverse to said stressed PCM;

passive segments of said stressed PCM situated under contacts of said RF switch;

at least one transition layer situated over said stressed PCM;

an encapsulation layer situated over said at least one transition layer and on first and second sides of said stressed PCM;

a stressor layer situated over said encapsulation layer and said stressed PCM.

2. The RF switch of claim 1, further comprising a contact dielectric situated over said stressor layer.

3. The RF switch of claim 1, wherein said stressor layer comprises material selected from the group consisting of silicon nitride ($Si_XN_Y$) and silicon oxynitride ($Si_XO_YN_Z$).

4. The RF switch of claim 1, wherein said stressor layer comprises a carbon ceramic.

5. The RF switch of claim 1, wherein said at least one transition layer comprises a germanium oxide ($Ge_XO_Y$) transition layer, a silicon oxide ($Si_XO_Y$), and a silicon nitride ($Si_XN_Y$) transition layer.

6. The RF switch of claim 1, wherein said at least one transition layer comprises a germanium nitride ($Ge_XN_Y$) transition layer and a silicon nitride ($Si_XN_Y$) transition layer.

7. The RF switch of claim 1, wherein said at least one transition layer comprises a germanium oxynitride ($Ge_XO_YN_Z$) transition layer and a silicon oxynitride ($Si_XO_YN_Z$) transition layer.

8. The RF switch of claim 1, wherein said stressed PCM is selected from the group consisting of germanium telluride ($Ge_XTe_Y$), germanium antimony telluride ($Ge_XSb_YTe_Z$), germanium selenide ($Ge_XSe_Y$), and any other chalcogenide.

9. A radio frequency (RF) switch comprising:

a phase-change material (PCM) and a heating element underlying an active segment of said PCM and extending outward and transverse to said PCM;

contacts of said RF switch extending into passive segments of said PCM;

adhesion layers adhering said passive segments of said PCM to said contacts.

10. The RF switch of claim 9, wherein said adhesion layers line said contacts.

11. The RF switch of claim 9, wherein said adhesion layers further adhere said passive segments of said PCM to a contact dielectric situated over said PCM.

12. The RF switch of claim 9, wherein said adhesion layers comprise titanium nitride (TiN).

13. A radio frequency (RF) switch comprising:

a stressed phase-change material (PCM) and a heating element underlying an active segment of said stressed PCM and extending outward and transverse to said stressed PCM;

at least one transition layer situated over said stressed PCM;

an encapsulation layer situated over said at least one transition layer and on first and second sides of said stressed PCM;

a stressor layer situated over said encapsulation layer and said stressed PCM;

contacts of said RF switch extending into passive segments of said stressed PCM;

adhesion layers adhering said passive segments of said stressed PCM to said contacts.

14. The RF switch of claim 13, further comprising a contact dielectric situated over said stressor layer.

15. The RF switch of claim 13, wherein said stressor layer comprises material selected from the group consisting of silicon nitride ($Si_XN_Y$) and silicon oxynitride ($Si_XO_YN_Z$).

16. The RF switch of claim 13, wherein said stressor layer comprises a carbon ceramic.

17. The RF switch of claim 13, wherein said at least one transition layer comprises a germanium oxide ($Ge_XO_Y$) transition layer, a silicon oxide ($Si_XO_Y$), and a silicon nitride ($Si_XN_Y$) transition layer.

18. The RF switch of claim 13, wherein said adhesion layers line said contacts.

19. The RF switch of claim 13, wherein said adhesion layers further adhere said passive segments of said stressed PCM to said at least one transition layer.

20. The RF switch of claim 13, wherein said adhesion layers comprise titanium nitride (TIN).

* * * * *

UNITED STATES PATENT AND TRADEMARK OFFICE
CERTIFICATE OF CORRECTION

PATENT NO. : 10,454,027 B1
APPLICATION NO. : 16/267719
DATED : October 22, 2019
INVENTOR(S) : Howard et al.

Page 1 of 1

It is certified that error appears in the above-identified patent and that said Letters Patent is hereby corrected as shown below:

In the Claims

Column 12, Line 39, Claim 20: "titanium nitride (TIN)." should be -- titanium nitride (TiN). --

Signed and Sealed this
Twenty-first Day of April, 2020

Andrei Iancu
*Director of the United States Patent and Trademark Office*